United States Patent [19]

Bonato

[11] Patent Number: 5,020,148
[45] Date of Patent: May 28, 1991

[54] IMAGE SUPPRESSION HARMONIC FREQUENCY CONVERTER OPERATING IN THE MICROWAVE FIELD

[75] Inventor: Paolo Bonato, Milan, Italy

[73] Assignee: Siemens Telecommunicazioni S.p.A., Milan, Italy

[21] Appl. No.: 289,070

[22] Filed: Dec. 22, 1988

[30] Foreign Application Priority Data

Dec. 24, 1987 [IT] Italy .......................................... 23219

[51] Int. Cl.⁵ .............................................. A04B 1/10
[52] U.S. Cl. .................... 455/302; 455/306; 455/317; 455/319; 455/327; 333/116
[58] Field of Search ............... 455/302, 303, 317, 318, 455/319, 323, 325, 326, 327; 333/116

[56] References Cited

U.S. PATENT DOCUMENTS

| | | | |
|---|---|---|---|
| 3,634,768 | 1/1972 | Carpenter et al. | 455/326 |
| 3,652,940 | 3/1972 | Reiter et al. | 455/325 |
| 4,118,670 | 10/1978 | Dickens | 455/327 |
| 4,457,022 | 6/1984 | Dydyk | 455/317 |
| 4,492,960 | 1/1985 | Hislop | 455/323 |
| 4,817,201 | 3/1989 | Bonato | 455/326 |

FOREIGN PATENT DOCUMENTS 0231541 12/1985 European Pat. Off. .
105103 10/1984 Japan ................... 455/325

OTHER PUBLICATIONS

Microwave Journal, vol. 25, No. 6, Jun. 1982, "Millimeter—Wave to Microwave Converter".

Primary Examiner—Reinhard J. Eisenzopf
Assistant Examiner—Lisa Charonel
Attorney, Agent, or Firm—Adel A. Ahmed

[57] ABSTRACT

An image suppression harmonic frequency converter capable of operating in any microwave range is described. Frequency conversion is obtained by making use of a local frequency which is half that of a conventional converter. In particular, the radiofrequency reception signal is converted into an intermediate frequency signal with suppression of the converted image band. Similarly, the intermediate frequency signal to be transmitted is converted into a single side band radiofrequency transmission signal. The converter comprises two harmonic mixers, a first inquadrature radiofrequency hybrid coupler, a second in-quadrature intermediate frequency hybrid coupler, two appropriate duplexer filters, two low-pass filters, two matching circuits, and two decoupling circuits.

15 Claims, 2 Drawing Sheets

IMAGE SUPPRESSION HARMONIC FREQUENCY CONVERTER OPERATING IN THE MICROWAVE FIELD

The present invention relates to an image suppression harmonic frequency converter operating in the microwave field.

Frequency conversion is known to be obtained by "multiplication" of a signal to be converted to the desired frequency by an appropriately determined local frequency. The multiplication is performed by causing the two signals to reach the ends of appropriate nonlinear devices called mixers such as, for example, Schottky diodes. As is known, in transmitters, frequency conversion produces two frequency bands placed symmetrically at the two sides of the local frequency and products of conversion of a higher order that normally are not taken into consideration because of decreasing amplitude and ease of filtration.

In microwave applications only one of the two side bands is generally transmitted for the dual purpose of saving transmission power and reducing band occupation. The other band, called the image, is usually suppressed.

It is very important that at least one part of the suppression take place before the converted signal enters the power amplification stages (generally capable of treating both the side bands equally), placed downstream from the conversion stage, in order to avoid distortions or saturation of the amplification stages caused by spurious signals with the consequent decrease in useful power transmitted.

In the case of receivers, the frequency conversion of the radiofrequency signal placed in the useful frequency band, supplies a signal in the intermediate frequency band. However, even the signal corresponding to the image band is converted into the intermediate frequency band. The latter conversion is, however, an undesired effect, principally because of the thermal noise always present in the image band, generally produced by the preamplification stage placed upstream from the conversion stage.

Image suppression is, thus, very important in reception as well, in order to avoid the noise being converted and then added into the noise present in the band of the converted useful signal. If this suppression did not take place, the signal-to-noise ratio would be halved (assuming that both the bands were treated equally) in comparison with image suppression conversion, consequently involving a 3 dB worsening in the noise factor.

The circuits which perform the frequency conversion are called converters and there are different types which, however, are all based on the same principle of multiplication of two signals. Their principal application is in radio receiving and/or transmitting systems.

A first type of frequency converter, called single side band or image suppression, uses a special circuitry arrangement capable of suppressing the image signal without the aid of a special filter placed on the radio frequency signal port. This undoubtedly constitutes a great advantage compared with conventional converters, i.e. those which use an image filter, since the filter makes the radio system costlier, cumbersome and endowed with poor flexibility of use. The converters belonging to the first type, generally comprise a radio frequency network in which are inserted one or more mixers which operate in combination with a local oscillator having frequency $f_{lo}=f_s\pm f_i$ (where $f_s$ is the frequency of the radio frequency signal transmitted or received and $f_i$ is the intermediate frequency of the receiving and/or transmitting equipment). The peculiar circuit structure of the radio frequency network is such that the converted power of the image signal is dissipated into a matched load.

A serious problem with the converters mentioned is the fact that, as frequency rises, it becomes difficult to make stable local oscillators at low cost capable of delivering the power necessary for good operation of the mixers.

This problem can be partly solved by having recourse to a second type of frequency converter, called harmonic.

It comprises one or more harmonic mixers, so-called because they are capable of suppressing conversion products of even order. Considering only the lowest order of conversion to be of practical interest, at least for our purposes, we can consider the harmonic converters as devices capable of performing a conversion with local oscillators with frequency $f_{lo}=\frac{1}{2}(f_s\pm f_i)$, i.e. with frequency half that of local oscillators which operate with conventional converters.

The second type of harmonic converter can, in a first case, be made in the conventional manner, i.e. using the image filter or, in a second case, using the image suppression technique peculiar to the first type of converter.

In the former case, as said above, the introduction of the filter involves the loss of the advantages linked with the use of a local oscillator with frequency half that of a conventional local oscillator.

In the latter case the advantages of the converters of the first and second types are added together. The advantages derive principally from the lack of the image filter and simultaneously from the use of a local frequency lower than that of the converters of the former type.

An example is already known of an image suppression harmonic frequency converter which, thus, represents the second case of the second type of converter mentioned. It is described in U.S. patent application Ser. No. 06/927,486, entitled "Single Side Band Harmonic Frequency Converter, In Particular for High-Frequency Receiving and Transmitting Systems", filed Nov. 6, 1986 based on the priority of Italian patent application No. 23404-A/85 filed on Dec. 30, 1985, in the name of this applicant.

The single side band harmonic frequency converter, particularly for high frequency receiving-transmission systems, comprises two harmonic mixers arranged in parallel, at least one radio frequency hybrid circuit connecting each harmonic mixer with a first signal frequency port and with a second local frequency port and an in-quadrature intermediate frequency hybrid circuit connecting each harmonic mixer with a third intermediate frequency port and a fourth port coupled to a termination. This converter uses a local oscillator with frequency $f_{lo}=\frac{1}{2}(f_s\pm f_i)$. The radio frequency hybrid circuit in this patent application is a 3 dB Lange interdigited in-quadrature coupler fabricated by the thin film technique.

A drawback of the harmonic frequency converter mentioned lies in the difficulty of fabricating the Lange coupler, especially for frequencies above 17 GHz. Accomplishing an interdigited coupler capable of operating at these frequencies requires, for example, interconnection, on an alumina substrate 250 μm thick, of lines 20 μm wide with 20 μm of gaps. The reduced dimensions do not allow making the connections by thermocompression of a wire 18 μm in diameter, therefore the interconnection must be made with special applications of the thin film technique.

The interconnections between the fingers of the hybrid, as mentioned above, call for a costly and sophisticated technology and also limit the operation to high frequencies because of the parasitic elements introduced.

Therefore, the object of the present invention is to overcome the above drawbacks and to provide an image suppression harmonic frequency converter operating preferably, but not exclusively, in the ranges 15, 18 and 23 GHz, and consisting principally of a tandem hybrid radio frequency coupler with half-open structure forming part of a new circuit structure.

In accordance with principles of the present invention, an image suppression harmonic frequency converter, comprises a first 3 dB in-quadrature radio frequency hybrid coupler of the tandem type with four ports, operating both with a radiofrequency signal and a local frequency signal. A first harmonic mixer is connected to a first port of the first hybrid coupler. A second harmonic mixer connected to a second port of the first hybrid coupler. A first duplexer pass-band filter, which lets pass both the radio frequency signal and an intermediate frequency signal and stops the local frequency signal preventing reflection thereof, has a first end connected to a fourth port of the first hybrid coupler, and a second end to which arrives or from which goes out the radio frequency signal. A second duplexer band-pass filter, which lets pass both the local frequency signal and the intermediate frequency signal and stops the radio frequency signal preventing reflection thereof, has a first end connected to a third port of the first hybrid coupler and a second end to which arrives the local frequency signal. A second 3 dB in-quadrature intermediate frequency hybrid coupler with four ports has a first port connected to the second end of the first band-pass filter, a second port connected to the second end of the second band-pass filter, a third port closing on a matched load and a fourth port to which arrives or from which goes out the intermediate frequency signal.

As will be explained more fully below, the adoption of the radio frequency hybrid in the new circuit structure allows the converter in accordance with the invention to operate on a single side band (i.e. with image suppression), using a local frequency half that of a conventional converter.

The converter which is the object of the present invention, compared with the harmonic converter disclosed in the above-mentioned patent application by this applicant, displays the advantage of being able to operate on much higher frequencies, allowing less costly and sophisticated fabrication technology.

Other purposes and advantages of the present invention will be made clear by the detailed description below of an example of an embodiment thereof, accomplished in microstrip, given for purely explanatory and nonlimiting reasons, and by the annexed drawings wherein.

Figure 1:
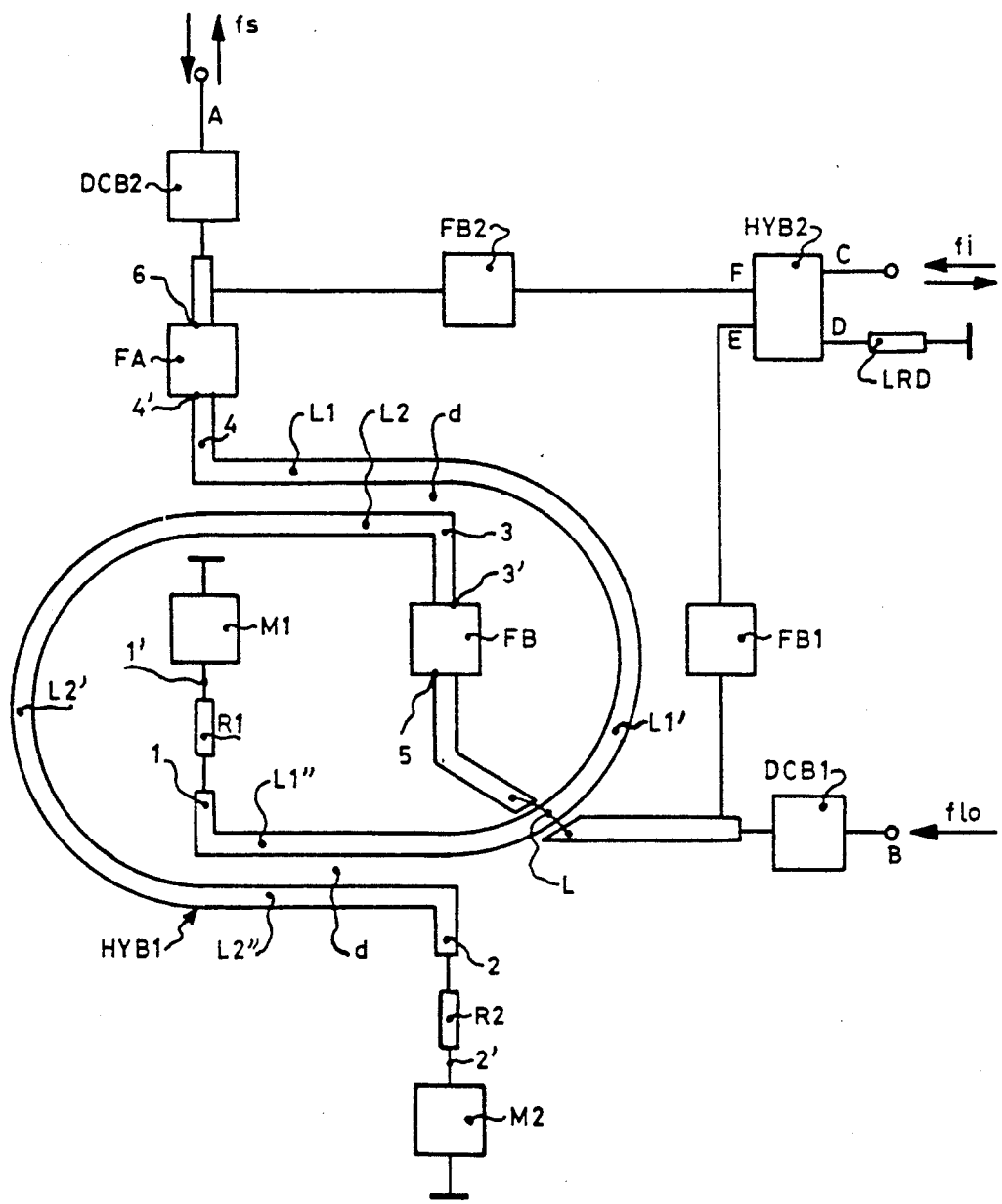
FIG. 1 shows a diagram of a converter in accordance with the invention.

With reference to FIG. 1, there can be seen an image suppression harmonic converter comprising (a) two identical balanced harmonic mixers M1 and M2, each of which consists of a pair of Schottky diodes (not shown) in antiparallel; (b) a first 3 dB in-quadrature radio frequency hybrid circuit HYB1 capable of operating both at frequency $f_{lo}$ and frequency $f_s = 2f_{lo} \pm f_i$; (c) a second 3 dB in-quadrature intermediate frequency hybrid coupler HYB2 of known type; (d) two low-pass filters FB1 and FB2 capable of passing the intermediate frequency $f_i$ and of stopping, without disturbing the converter's operation at the working frequencies, both the local frequency $f_{lo}$ and the signal frequency $f_s$; (e) a first duplexer band-pass filter FA capable of passing the signal frequency $f_s$ and stopping the local frequency $f_{lo}$ without reflecting the respective signals; (f) a second duplexer band-pass filter FB, capable of passing the local frequency $f_{lo}$ and stopping the signal frequency $f_s$ without reflecting the respective signals; (g) two decoupling circuits from direct current DCB1 and DCB2, each of which consists, in a known manner, of two coupled lines, also capable of stopping the intermediate frequency signal $f_i$; (h) two identical impedance matching networks R1 and R2 consisting of appropriate line sections, the geometry of which depends on the impedance which the mixers M1 and M2 display at the working frequencies; (i) a termination LRD consisting of a section of resistive line of appropriate length; and (j) a line jumper L.

The hybrid coupler HYB1 is a 4-port tandem circuit displaying a half-open structure. In the figures the ports are indicated with reference numbers 1, 2, 3 and 4. A signal present at port 3 is found again at half power respectively at port 1 with a delayed phase shift of $\phi$ and, also at half power, at port 2 with a delayed phase shift of $\pi/2 + \phi$, $\phi$ being a phase shift which depends on the length of the patch included between ports 3 and 2 or identically between ports 1 and 4.

Similarly, a signal present at port 4 is found again at half power respectively at port 2 with delayed phase shift of $\phi$ and, also at half power, at port 1 with a delayed phase shift of $\pi/2 + \phi$. Port 3 and 4 are decoupled just as are ports 1 and 2.

The hybrid coupler HYB1 comprises four segments consisting of line sections of appropriate length L1, L2, L1″ and L2″, the section L1 being placed at a coupling distance d from L2 and the section L1″ placed at the same distance d from L2″ respectively. The section L1 is also connected to the section L1″ by a semicircular line section of appropriate length L1′, while the section L2 is connected to the section L2″ by a semicircular line section L2′ of a length identical with that of L1′ in order to make the coupler symmetrical.

The coupling distance d depends, as known, on the following parameters: the value of the operating frequencies of the hybrid; the thickness and dielectric constant of the substrate; the thickness of the metallization; and the value of the desired coupling between the lines at the working frequencies $f_{lo}$ and $f_s$.

The length of the coupled line sections L1, L2 and L1″, L2″ is approximately equal to one quarter the mean value between the wavelength of the band center frequency of the radio frequency signals $f_s$ and the local oscillator frequency $f_{lo}$.

The coupler HYB2 is a known 3 dB in-quadrature hybrid circuit with four ports, indicated in the figures by the letters D, C, E and F. The phase relationships between the signals present at the various HYB2 ports are similar to those of the hybrid HYB1, making port 1, 2, 3 and 4 of HYB1 correspond with ports D, C, E and F of HYB2. A frequency signal $f_s$, included in the radio frequency band considered, is present at port A of the converter. The signal is considered to be entering in case of reception and outgoing in case of transmission, as indicated in the figures by the double arrow. The port, through the decoupling circuit DCB2, is connected to a first port 6 of the filter FA and to one end of the low-pass filter FB2 respectively. The second port 4' of the filter FA is connected to port 4 of the hybrid HYB1. The other end of the filter FB2 is connected to port F of the hybrid HYB2.

Similarly an output frequency signal $f_{lo}$ from a local oscillator (not visible in the figures) reaches port B of the converter and, through the decoupling circuit DCB1, to one end of the low-pass filter FB1 and, by means of the line jumper L, a first port 5 of the filter FB, respectively, of which the second port 3' is connected to port 3 of the hybrid HYB1. The other end of the filter FB1 is connected to port E of the hybrid HYB2.

Port 1 of HYB1 is connected through the matching network R1 to a terminal 1' of the harmonic mixer M1 whose other terminal is connected to ground. Port 2 of HYB1 is connected through the matching network R2 to a terminal 2' of the harmonic mixer M2 whose other terminal is connected to ground.

At port C of HYB2 there is a signal at the intermediate frequency $f_i$. The signal is considered entering in case of transmission and outgoing in case of reception, as indicated in the figures by the double arrow. The port D is connected to the termination LRD to ground.

As may be seen in FIG. 1, the duplexer filter FB, the mixer M1 and its matching network R1 are inside the hybrid HYB1. Ports 1 and 3 of HYB1 are also inside the hybrid. This characterizes a closed structure, made half-open by the line jumper L which makes port 5 accessible from the outside.

As will be explained below, the line jumper L is placed at a point which does not significantly disturb the operation of HYB1.

Figure 2:
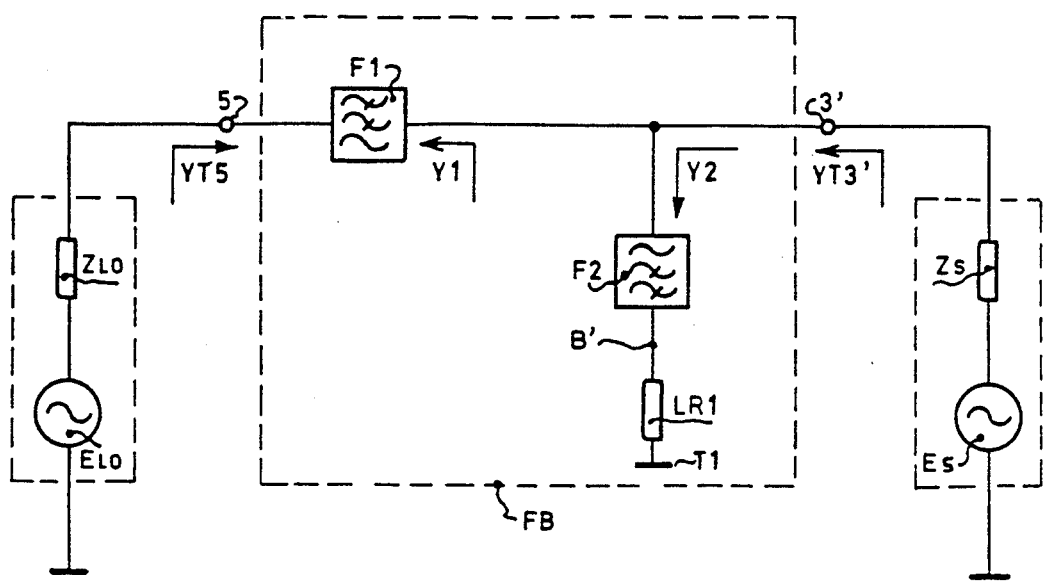
FIG. 2 shows a block diagram of the filter FB of FIG. 1.

With reference to FIG. 2, where the same elements as in FIG. 1 are shown with the same symbols, F1 indicates a low-pass filter which passes the frequency $f_{lo}$, and F2 indicates a high-pass filter that passes the frequency $f_s$. LR1 is a resistive line section. and $E_{lo}$, $Z_{lo}$ and $E_s$, $Z_s$ represent the output voltage and the impedance of the equivalent generator, of the local oscillator and the radio frequency signal generator respectively seen at ports 5 and 3' of the filter FB. A first end of the filter F1 is connected to the first port 5 of FB, the second end is connected both to port 3' of FB and to one end of the filter F2. The other end of F2 is connected, through port B', to one of the resistive line LR1 the other end of which is connected to a ground T1. The ground is meant as a radio frequency ground for the signals at frequencies $f_s$ and $f_{lo}$, and an open circuit as concerns the intermediate frequency $f_i$.

The symbols $Y_1$ and $Y_2$ represent the admittances, seen at the ends indicated by the arrows, only of filters F1 and F2. The symbols $Y_{T5}$ and $Y_{T3}$ represent the total admittances seen at ports 5 and 3' of FB. In addition the following relationship applies:

$$1/Z_{lo}=1/Z_s=1/L_{r1}1/50s$$

At the frequency $f_s$ we have for the above $Y_1=0$ and hence:

$$Y_{T3'}=Y_2=1/LR1=1/50 \text{ S}$$

so that the signal at the frequency fs present at port 3' finds a matched load and flows all into the termination LR1 without reaching port 5.

At the frequency $f_{lo}$ we have for the above $Y_2=0$ and hence:

$$Y_{T5}1/Z_s1/50$$

so that the signal at the frequency $f_{lo}$ present at port 5 finds a matched load and flows all to port 3'.

Figure 3:
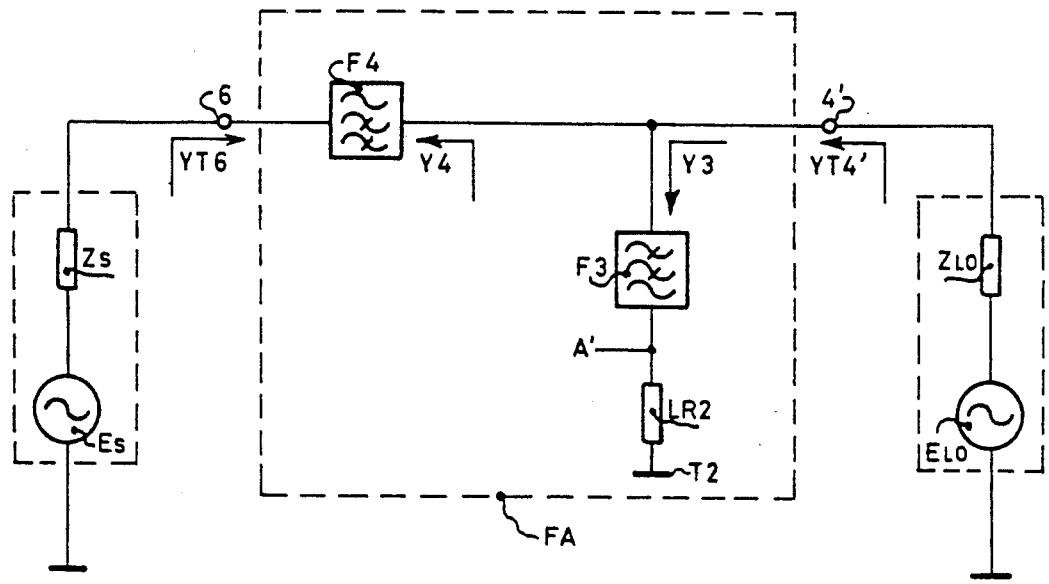
FIG. 3 shows a block diagram of the filter FA of FIG. 1.

With reference to FIG. 3, where the same elements as in FIGS. 1 and 2 are indicated by the same symbols, we note a low-pass filter F3 and a high pass filter F4 identical with filters F1 and F2 respectively of FIG. 2.

One end of the high-pass filter F4 is connected to port 6 of FA and the other end is connected both to one end of the low pass filter F3 and to port 4' of FA. The other end of F3 is connected, through port A', to one end of the resistive line LR2, of which the other end is connected to a ground T2. The ground is meant as a radio frequency ground for the signals at the frequencies $f_s$ and $f_{lo}$, and an open circuit as concerns the intermediate frequency $f_i$.

The equivalent signal generator $E_s$, $Z_s$ and the local oscillator equivalent generator $E_{lo}$, $Z_{lo}$ are connected to ports 6 and 4' respectively of the filter FA.

The symbols $Y_{T6}$ and $Y_{T4}$, represent the total admittances seen at ports 6 and 4' of FA.

At the frequency $f_s$ we have for the above $Y_3=0$ and therefore:

$$Y_{T6}=1/Z_{lo}=1/50 \text{ S}$$

so that the signal at the frequency $f_s$ present at port 6 finds a matched load and flows all to port 4'.

At the frequency $f_{lo}$ we have for the above $Y_4=0$ and therefore:

$$Y_{T4'}=Y_3=1/LR2=1/50 \text{ S}$$

so that the signal at the frequency $f_{lo}$ present at port 4' finds a matched load and flows all into the termination LR2 without reaching port 6.

The embodiment of the filters FA and FB is identical with that described in the previous patent application described above filed by this applicant. In particular the filters F1, F2, F3 and F4 are accomplished, as described in the previous patent, by means of line sections. The converter shown in FIG. 1 can operate in both reception and transmission.

In the first case the radio frequency signal below is applied to port A:

$$v_s=V_s \cos 2\pi f_s t$$

and to port B is applied the signal:

$$v_{lo}=V_{lo} \cos 2\pi f_{lo} t$$

supplied by a local oscillator.

Subsequently, applying the general relationship $\omega=2\pi f$, the pulsation symbol will be used in the formulas instead of the frequency symbol f. The subscripts will identify unequivocally the various signals. The local frequency can be such as to satisfy either of the following equations:

(a) $\omega_{s2} 2\omega_{lo}\omega_i$ (b) $\omega_{s1} = 2\omega_{lo} - \omega_i$ where $\omega_{s1}$ indicates a frequency belonging to the lower side band of the reception signal, and $\omega_{s2}$ a corresponding frequency belonging to the upper sideband.

By the effect of the quadrature hybrid HYB1 (selected in such a manner as to operate both in the frequency band around $f_s$ and the one around $f_{lo}$) the equation (a) describes, in a known manner, a voltage $v_1$ at port 1 of HYB1 given by the following expression:

$$v_1 = \frac{V_{lo}}{\sqrt{2}} \cos \omega_{lo} t + \frac{V_s}{\sqrt{2}} \cos\left(\omega_{s2} t - \frac{\pi}{2}\right)$$

The signal phase shifts relative to paths respectively identical have been omitted in the remainder of the treatment for simplicity of presentation as they are without influence for the purposes of the treatment.

Voltage v1, applied to the ends of the mixer M1, produces a current i1 the behavior of which is described by a known mathematical formula. Developing this formula in series and considering only the terms of the development which interest us, we obtain for the current i1 the following expression:

$$i_1 = F \frac{V_s}{2} \cos\left[2\omega_{lo} t - \left(2\omega_{lo} t + \omega_i t - \frac{\pi}{2}\right)\right]$$

$$= F \frac{V_s}{2} \cos\left(-\omega_i t + \frac{\pi}{2}\right) = F \frac{V_s}{2} \cos\left(\omega_i t - \frac{\pi}{2}\right)$$

where F is a first constant dependent on the amplitude of the signal $v_{lo}$ and the mixer M1, applying an identical dependence for the mixer M2 also.

At port 2 of HYB1 is created a voltage $v_2$ given by the following expression:

$$v_2 = V_{lo} \cos\left(\omega_{lo} t - \frac{\pi}{2}\right) + V_s \cos \omega_{s2} t$$

The voltage applied to the ends of the mixer M2 produces a current $i_2$ which, due to considerations similar to those made above for $i_1$, assumes the following expression:

$$i_2 = F \frac{V_s}{2} \cos[2\omega_{lo} t - \pi - (2\omega_{lo} t + \omega_i t)]$$

$$= F \frac{V_s}{2} \cos(-\omega_i t - \pi) = F \frac{V_s}{2} \cos(\omega_i t + \pi) = -F \frac{V_s}{2} \cos \omega_i t$$

The current $i_1$ circulates from port 1 to port 4 of HYB1, through the filters FA and FB2, reaching the port of HYB2. Similarly the current $i_2$ circulates from port 2 to port 3 of HYB1, through the filters FB and FB1, and reaches port E of HYB2. The paths which $i_1$ and $i_2$ follow to reach the respective ports F and E must be of the same length so that the currents maintain a constant phase relationship.

Due to the effect of the in-quadrature hybrid HYB2 there are consequently present at the outputs C and D the following currents:

$$i_c = F \frac{V_s}{2\sqrt{2}} \left[\cos\left(\omega_i t - \frac{\pi}{2} - \frac{\pi}{2}\right) + (-\cos \omega_i t)\right]$$

$$= -F \frac{V_s}{\sqrt{2}} \cos \omega_i t$$

$$i_d = F \frac{V_s}{2\sqrt{2}} \left\{\cos\left(\omega_i t - \frac{\pi}{2}\right) + \left[-\cos\left(\omega_i t - \frac{\pi}{2}\right)\right]\right\} = 0$$

In other terms, the conversion of the frequency $\omega_{s2}$ does not produce any intermediate frequency signal at the output D, which therefore can be connected to the termination LRD while an intermediate frequency signal can be picked up at the output C. From equation (b), applying the same considerations as for equation (a), the following expressions are derived:

$$v_1 = \frac{V_{lo}}{\sqrt{2}} \cos \omega_{lo} t + \frac{V_s}{\sqrt{2}} \cos\left(\omega_{s1} t - \frac{\pi}{2}\right)$$

$$i_1 = F \frac{V_s}{2} \cos\left[2\omega_{lo} t - \left(2\omega_{lo} t - \omega_i t - \frac{\pi}{2}\right)\right]$$

$$= F \frac{V_s}{2} \cos\left(\omega_i t + \frac{\pi}{2}\right)$$

$$v_2 = \frac{V_{lo}}{\sqrt{2}} \cos\left(\omega_{lo} t - \frac{\pi}{2}\right) + \frac{V_s}{\sqrt{2}} \cos \omega_{s1} t$$

$$i_2 = F \frac{V_s}{2} [\cos(2\omega_{lo} t - \pi) - (2\omega_{lo} t - \omega_i t)]$$

$$= F \frac{V_s}{2} \cos(\omega_i t - \pi) = -F \frac{V_s}{2} \cos \omega_i t$$

$$i_c = F \frac{V_s}{2\sqrt{2}} \left[\cos\left(\omega_i t + \frac{\pi}{2} - \frac{\pi}{2}\right) + (-\cos \omega_i t)\right] = 0$$

$$i_d = F \frac{V_s}{2\sqrt{2}} \left[\cos\left(\omega_i t + \frac{\pi}{2}\right) + \cos\left(\omega_i t - \pi - \frac{\pi}{2}\right)\right]$$

$$= F \frac{V_s}{\sqrt{2}} \cos\left(\omega_i t + \frac{\pi}{2}\right)$$

In this case the situation is then inverted compared to the previous case, i.e., due to the effect of the conversion of $\omega_{s1}$, there is present a signal at frequency $\omega_i$ at output D, while no signal at frequency $\omega_i$ is present at output C, which therefore can be connected to the termination LRD.

Now let us suppose that $\omega_{s1}$ and $\omega_{s2}$ are present simultaneously at port A of the converter. As said in relation to the equations (a) and (b), it can be seen that the intermediate frequencies corresponding to the conversion of $\omega_{s1}$ and $\omega_{s2}$, are separately present at ports D and C of HYB2. Therefore, by connecting the matched load LRD to the port corresponding to the conversion of a side band, e.g. the image port, the power thereof is dissipated on the termination. At the other port it is possible to pick up the intermediate frequency corresponding to the conversion of the other side band, corresponding to the useful signal.

Now let us examine the operation of the converter in transmission. In this case, while at port B there is still applied the signal:

$$v_{lo} = V_{lo} \cos \omega_{lo} t$$

supplied by a local oscillator, a distinction must be made between two assumptions corresponding to the application of an intermediate frequency signal:

$$v_i V_i \cos \omega_i t$$

at port C or port D of HYB2 (with the other port connected to an appropriate termination).

In the former case, i.e..with a voltage vi applied at port C, the following voltages, $v_1$ and $v_2$, are created in a known manner at ports 1 and 2, respectively, of HYB1 (of FIG. 1) due to the effect of HYB2 and HYB1:

$$v_1 = \frac{V_i}{\sqrt{2}} \cos\left(\omega_i t - \frac{\pi}{2}\right) + \frac{V_{lo}}{\sqrt{2}} \cos \omega_{lo} t$$

$$v_2 = \frac{V_i}{\sqrt{2}} \cos \omega_i t + \frac{V_{lo}}{\sqrt{2}} \cos\left(\omega_{lo} t - \frac{\pi}{2}\right)$$

the voltages, applied to the ends of the mixers M1 and M2 respectively, produce two currents $i_1$ and $i_2$ of which behavior is described by a known mathematical formula.

Developing this formula in series and considering only the terms of the development which interest us, we find for the currents i1 and i2 the following expressions:

$$i_1 = K V_i \cos\left[2\omega_{lo} t - \left(\omega_i t - \frac{\pi}{2}\right)\right] +$$

$$K V_i \cos\left[2\omega_{lo} t + \left(\omega_i t - \frac{\pi}{2}\right)\right]$$

$$= K V_i \cos\left(2\omega_{lo} t - \omega_i t + \frac{\pi}{2}\right) +$$

$$K V_i \cos\left(2\omega_{lo} t + \omega_i t - \frac{\pi}{2}\right)$$

$$i_2 = K V_i \cos(2\omega_{lo} t - \pi - \omega_i t) +$$

$$K V_i \cos(2\omega_{lo} t - \pi + \omega_i t)$$

where K is a second constant which depends on the amplitude of the signal $v_{lo}$ and the mixers M1 or M2.

At ports 3 and 4 of HYB1 there are consequently present the following currents:

$$i_3 = K \frac{V_i}{\sqrt{2}} \left[ \cos\left(2\omega_{lo} t - \omega_i t + \frac{\pi}{2}\right) + \cos\left(2\omega_{lo} t + \omega_i t - \frac{\pi}{2}\right) + \right.$$

$$\left. \cos\left(2\omega_{lo} t - \omega_i t - \pi - \frac{\pi}{2}\right) + \cos\left(2\omega_{lo} t + \omega_i t - \pi - \frac{\pi}{2}\right) \right]$$

$$= \sqrt{2} K V_i \cos\left(2\omega_{lo} t - \omega_i t + \frac{\pi}{2}\right)$$

$$i_4 = K \frac{V_i}{\sqrt{2}} \left[ \cos\left(2\omega_{lo} t - \omega_i t + \frac{\pi}{2} - \frac{\pi}{2}\right) + \right.$$

$$\cos\left(2\omega_{lo} t + \omega_i t - \frac{\pi}{2} - \frac{\pi}{2}\right) + \cos(2\omega_{lo} t - \pi - \omega_i t) +$$

$$\left. \cos(2\omega_{lo} t - \pi + \omega_i t) \right]$$

$$= \sqrt{2} K V_i \cos(2\omega_{lo} t + \omega_i t - \pi)$$

At the port 3 of HYB1, i.e. at port 3' of FB, there is present the following voltage:

$$v_3 = \sqrt{2} \frac{K}{Y_{T3'}} V_i \cos\left(2\omega_{lo} t - \omega_i t + \frac{\pi}{2}\right)$$

which corresponds to that of a signal belonging to the lower side band of the radio frequency signal $V_s$.

Similarly, at port 4 of HYB1, i.e. at port 4' and consequently at port 6 of FA, there is present the following voltage:

$$v_4 = \sqrt{2} \frac{K}{Y_{T4'}} V_i \cos(2\omega_{lo} t + \omega_i t - \pi)$$

which corresponds to that of a signal belonging to the upper side band of the radio frequency signal $v_s$.

In the second case, i.e. with a voltage $v_i$ applied to port D, the signals present at ports 3 and 4 of HYB1 are exchanged compared with the above case. With similar considerations to those relative to the former case, at port 3 of HYB1, i.e. at port 3' of FB, we have:

$$v_3 = \sqrt{2}\ \frac{K}{Y_{T3'}}\ V_i \cos(2\omega_{lo}t + \omega_i t - \pi)$$

which corresponds to a signal belonging to the upper side band of the radio frequency signal $v_S$.

Similarly at port 4 of HYB1, i.e. at port 4' and consequently at port 6 of FA, we have:

$$v_4 = \sqrt{2}\ \frac{K}{Y_{T4'}}\ V_i \cos\left(2\omega_{lo}t - \omega_i t + \frac{\pi}{2}\right)$$

which corresponds to a signal belonging to the lower side band of the radio frequency signal $v_S$.

The radio frequency signal of interest for transmission purposes is the signal v4 present at port 4 of HYB1 which, as mentioned, corresponds to only one side band.

It is also possible, concerning the above, to select which of the two side bands to transmit. Indeed, applying the intermediate frequency signal $f_i$ at port C of HYB2 brings about transmission of the upper side band, while applying it to port D of HYB2 brings about transmission of the lower side band.

In the case of transmission it is appropriate to note the operation of the radio frequency duplexer filters FA and FB making a distinction between this case and reception.

Indeed, in reception, the power of the image signal is dissipated on the termination LRD of HYB2. In transmission the power of the side band which is not transmitted is dissipated on the termination LR1 of the filter FB (FIG. 2).

A typical problem of the frequency converter concerns isolation between the radio frequency port and the local frequency port. The isolation also depends on the degree of impedance matching of the mixer diodes which, if not perfect, may compromise the degree of image suppression.

In our case the isolation between ports A and B, as concerns the respective signals, was obtained by the use of filters FA and FB, the operation of which was explained above. Isolation of ports A and B with regard to the intermediate frequency signal $f_i$ was obtained by means of the respective decoupling circuits DCB2 and DCB1 which prevent the signal $f_i$ from reaching the ports.

Now let us examine the case in which M1 and M2 are not perfectly matched to the frequencies $f_{lo}$ and $f_s = 2f_{lo} \pm f_i$; for the sake of simplicity let M1 and M2 be identical.

Let $\Gamma_{lo}e^{j\phi}$ indicate the reflection coefficient at ports 1 and 2 considered at frequency $f_{lo}$; $\Gamma_s e^{j\psi}$ indicates the coefficient of reflection at ports 1 and 2 considered at the frequency $f_s$.

Applying to port 3 of HYB1 the signal:

$$v_{lo}(t) = R_E(V_{lo}e^{j\omega_{lo}t})$$

and to port 4 of HYB1 the signal:

$$v_s(t) = R_E(V_{lo}e^{j\omega_s t})$$

the signals reflected at ports 1 and 2 of HYB1 because of the impedance mismatching of M1 and M2, are transferred due to the effect of the hybrid HYB1 to port 3 and 4 of HYB1.

At port 3 will be simultaneously present the following reflected signals:

$$v_{3s} = \frac{1}{\sqrt{2}}\left[\frac{1}{\sqrt{2}}\Gamma_s v_s e^{j(\psi - \pi/2)} + \frac{1}{\sqrt{2}}\Gamma_s v_s e^{j(\psi - \pi/2)}\right] \quad (1)$$

$$= \Gamma_s v_s e^{j(\psi - \pi/2)}$$

$$v_{3lo} = \frac{1}{\sqrt{2}}\left[\frac{1}{\sqrt{2}}\Gamma_{lo} v_{lo} e^{j\phi} + \frac{1}{\sqrt{2}}\Gamma_{lo} v_{lo} e^{j(\phi - \pi)}\right] = 0 \quad (2)$$

Due to the effect of the duplexer filter FB, the power of the reflected signal given by equation (1) above is dissipated on the matched load LR1, avoiding reaching the local frequency port B of the converter. Similarly to port 4 of HYB1 we find:

$$v_{4s} = 0 \quad (3)$$

$$V_{4lo}V_{lo}\Gamma_{lo}e^{j(\phi - \pi/2)} \quad (4)$$

Due to the effect of the duplexer filter FA, the power of the reflected signal given by equation (4) above is dissipated on the matched load LR2, avoiding reaching the radio frequency port A of the converter. Hence, the presence of the filters FA and FB makes the circuit perfectly matched, whatever the degree of matching at the frequency $f_{lo}$ and $f_s$ of the diode pairs included in the mixers M1 and M2, also allowing perfect isolation between ports A and B of the converter. The parasitic reactance introduced by the line jumper L which connects port B to the duplexer filter FB has practically negligible importance for the purposes of operation of the converter. Indeed, the filter FB placed in series with the reactance allows ignoring its effects as regards the signal $f_s$. As regards the signal $f_{lo}$, the influence of the parasitic reactance is considerably lower, approximately half what is would have if the local frequency were that of a conventional local oscillator.

In any case, since the losses due to mismatching and radiation due to parasitic reactance only concern the signal $f_{lo}$, it is possible to regulate the amplitude of the signal in order to recover the losses as regards operation of the converter. It must also be made clear that the performance of the converter is not significantly affected by small variations in the level of the local frequency signal.

The harmonic converter which is the object of this invention has, for example, been embodied in microstrip in the $f_s$ ranges of 15, 18 and 23 GHz and, in a band of frequencies within approximately 10% of range center, exhibits image frequency suppression values, both in transmission and reception, of $\geq 20$ dB and conversion losses between 7 and 9 dB, depending on the range of frequencies for which the converter was designed and the Schottky diodes employed.

The value of the intermediate frequency $f_i$ can reach is up to 5% of $f_s$.

From the description given, the advantages of the image suppression harmonic frequency converter operating in the microwave field, the object of the present invention, are clear. In particular, they are represented by the adoption of a tandem radio frequency hybrid coupler with half-open structure which, compared with the previous Lange coupler, allows operation of the converter at higher frequencies, necessitating a less costly and less sophisticated technological process and also allowing a reduction in circuit dimensions.

Another advantage derives from the fact that, because of the peculiar circuit structure adopted and introduced for the two duplexer filters FA and FB, for the two low-pass filters FB1, FB2, and for the two decouplers DCB1 and DCB2, it is possible to obtain good isolation among all the input ports of the converter. In addition the circuit is well matched whatever the degree of matching of the two mixers Ml and M2 to the local and signal frequencies.

What I claim is:

1. An image suppression harmonic frequency converter, comprising:
   a first 3 dB in-quadrature radio frequency hybrid coupler of the tandem type with four ports, operating both with a radio frequency signal and a local frequency signal;
   a first harmonic mixer connected to a first port of said first hybrid coupler;
   a second harmonic mixer connected to a second port of said first hybrid coupler;
   a first duplexer pass-band filter which passes both the radio frequency signal and an intermediate frequency signal and stops the local frequency signal preventing reflection thereof, said first filter having a first end connected to a fourth port of said first hybrid coupler, and a second end to which arrives or from which goes out the radio frequency signal;
   a second duplexer band-pass filter which passes both the local frequency signal and the intermediate frequency signal and stops the radio frequency signal preventing reflection thereof, said second filter having a first end connected to a third port of said first hybrid coupler and a second end to which arrives the local frequency signal;
   a second 3 dB in-quadrature intermediate frequency hybrid coupler with four ports which has a first port connected to said second end of said first band-pass filter, a second port connected to said second end of said second band-pass filter, a third port closing on a matched load and a fourth port to which arrives or from which goes out the intermediate frequency signal.

2. The image suppression harmonic frequency converter in accordance with claim 1, wherein the connection between said second end of said first band-pass filter and said first port of said second hybrid coupler takes place by means of the interposition of a first low-pass filter which passes the intermediate frequency signal and stops both the local frequency and the radio frequency signal.

3. The image suppression harmonic frequency converter in accordance with any one of claims 1 or 2, wherein the connection between said second end of said second band-pass filter and said second port of said second hybrid coupler takes place by means of the interposition of a second low-pass filter which passes the intermediate frequency signal and stops both the local frequency signal and the radio frequency signal.

4. The image suppression harmonic frequency converter in accordance with claim 1, wherein:
   the connection between said first harmonic mixer and said first port of said first hybrid coupler takes place by means of the interposition of a first impedance matching network; and
   the connection between said second harmonic mixer and said second port of said first hybrid coupler takes place by means of the interposition of a second impedance matching network.

5. The image suppression harmonic frequency converter in accordance with any of claims 1 or 2, wherein said local frequency signal reaches said second end of said second band-pass filter through a first decoupling circuit which stops both the direct current and the intermediate frequency signal an passes the local frequency.

6. The image suppression harmonic frequency converter in accordance with any of claims 1 or 2, wherein said radio frequency signal reaches said second end of said first band-pass filter through a second decoupling circuit which stops both the direct current and the intermediate frequency signal and passes the radio frequency signal.

7. The image suppression harmonic frequency converter in accordance with claim 1, wherein said first hybrid coupler comprises:
   a first line section and a second line section of a certain length placed at an appropriate coupling distance apart to aid coupling thereof;
   a third line section and a fourth line section of a certain length placed also at said coupling distance apart; wherein
   said first line section is joined to said third line section by means of a fifth line section of predetermined length and said second line section is joined to said fourth line section by means of a sixth line section of a length equal to that of said fifth line section.

8. The image suppression harmonic frequency converter in accordance with claim 7, wherein said length of said first, second, third and fourth coupled line sections is equal to approximately one quarter of the mean value between the wavelength of the band-center frequency of the radio frequency signal and the local frequency.

9. The image suppression harmonic frequency converter in accordance with claims 7 or 8, wherein said fifth and sixth line sections are semicircular.

10. The image suppression harmonic frequency converter in accordance with one of claims 4 and 7, wherein said first bandpass filter, said first harmonic mixer and said first impedance matching network are within the space included between said second, third, fifth and sixth line sections of said first hybrid coupler.

11. The image suppression harmonic frequency converter in accordance with claim 10 wherein the local frequency signal which passes through said first decoupling circuit reaches said second end of said first band-pass filter by means of a jumper placed on one of said line sections which join together said coupled line sections and of said first hybrid coupler.

12. The image suppression harmonic frequency converter in accordance with claim 1, wherein the frequency value of said local frequency signal is equal to half of the value of the sum of the frequency of said radio frequency signal and the frequency of said intermediate frequency signal.

13. The image suppression harmonic frequency converter in accordance with claim 1, wherein the value of said local frequency is equal to half of the value of the difference between the frequency of said radio frequency signal and the frequency of said intermediate frequency signal.

14. The image suppression harmonic frequency converter in accordance with claim 1, wherein when said radio frequency signal has a double side band there are present at said third port and said fourth port of said second hybrid coupler respectively, the upper side band and the lower side band of said radio frequency signal converted to the intermediate frequency.

15. The image suppression harmonic frequency converter in accordance with claim 1, wherein when the intermediate frequency signal is present either at said third port or at said fourth port of said second hybrid coupler there can be obtained at said fourth port of said first hybrid coupler the upper or lower side band respectively of the radio frequency signal.

* * * * *